United States Patent [19]

Ikeya et al.

[11] Patent Number: 5,139,437
[45] Date of Patent: Aug. 18, 1992

[54] SOCKET

[75] Inventors: Kiyokazu Ikeya, Shizuoka; Osamu Yamazaki, Kanagawa, both of Japan

[73] Assignee: Texas Instruments Incorporated, Dallas, Tex.

[21] Appl. No.: 682,751

[22] Filed: Apr. 8, 1991

[30] Foreign Application Priority Data

May 14, 1990 [JP] Japan .................................. 2-123384

[51] Int. Cl.⁵ ............................................ H01R 11/22
[52] U.S. Cl. ...................................... 439/266; 439/331
[58] Field of Search ................. 439/72, 73, 262–264, 439/266, 330, 331, 525, 526

[56] References Cited

U.S. PATENT DOCUMENTS

| | | | |
|---|---|---|---|
| 4,189,199 | 2/1980 | Grau | 439/264 |
| 4,402,563 | 9/1983 | Sinclair | 439/264 |
| 4,407,555 | 10/1983 | Lockard | 439/73 |
| 4,789,345 | 12/1988 | Carter | 439/266 |
| 4,993,955 | 2/1991 | Savant | 439/331 |

FOREIGN PATENT DOCUMENTS

0065783  3/1989  Japan .................................. 439/266

Primary Examiner—Larry I. Schwartz
Assistant Examiner—Hien D. Vu
Attorney, Agent, or Firm—Russell E. Baumann; Richard L. Donaldson; René E. Grossman

[57] ABSTRACT

A socket for mounting an integrated circuit chip to electrically connect chip leads in a test circuit during burn-in testing of the chip has rotably-mounted chip holders and has a plurality of resilient contacts arranged to be movable with forward motion of a reciprocating member to displace the holders and contacts against a bias force to receive the chip in the socket. The holders and contacts are movable with return motion of the reciprocating member to return to their original positions in response to the noted bias to detachably retain the chip in the socket and resiliently engage the contacts with respective chip leads with selected force. A rotably movable subordinate lever element engages the reciprocating member and the contacts to facilitate moving of the contacts as a group between their original and displaced positions in response to movement of the reciprocating member.

6 Claims, 5 Drawing Sheets

SOCKET

BACKGROUND OF THE INVENTION

The field of this invention is that of sockets for use in mounting and connecting electrical components such as integrated circuit (IC) chips in electrical circuits, and the invention relates more particularly to such sockets for mounting IC chips in test circuits during burn-in testing of the chips.

Integrated circuit chips are commonly mounted in sockets on a printed circuit board and are connected in an electrical test circuit on the board. The board is then disposed in an oven or furnace where the chip is tested in the circuit under the furnace temperature conditions. A variety of different types of sockets have been used for this purpose. One recently developed socket as shown in commonly assigned application for U.S. patent Ser. No. 421,220 filed Oct. 13, 1989, permits an IC chip to be easily installed in the socket for testing by movement of a reciprocating member and permits the test to be automated. However, it is sometimes found that the electrical contacts used in the recently developed sockets have relatively large arm-like shapes which can be subject to vibration and can tend to act as antenna. The arm sizes also tend to result in the sockets being less compact than would be desired so that fewer sockets can be accommodated on a circuit board or accommodated in a furnace during testing.

BRIEF SUMMARY OF THE INVENTION

It is an object of this invention to provide a novel and improved IC chip socket; to provide such a socket which is particularly adapted for use in burn-in testing; to provide such a burn-in test socket which is more compact to enhance mounting density during burn-in testing; to provide such sockets which permit easier installation and removal of IC chips from the socket with less risk of damage to socket contacts; and to provide such sockets which provide improved performance.

Briefly described, the novel and improved socket of the invention comprises a socket body of rigid electrical insulating material having a plurality of resilient electrical contacts mounted on the body. Holding means such as a pair of U-shaped brackets or holders are rotably mounted on the body for movement between original and displaced positions thereof. Spring means bias the holding means to their original positions. Subordinate element means such as a pair of subordinate lever elements are also rotably mounted on the body for movement between original and displaced positions. Additional spring means bias the subordinate lever elements to their original positions. The subordinate lever elements are arranged to engage the contacts as the elements are moved to their displaced positions for displacing the contacts against their inherent resilience. A reciprocating member is mounted for forward and return motion on the body. The reciprocating member is arranged so that the subordinate lever element and the holding means are movable with forward motion of the reciprocating member to displace the contacts and holding means from their original positions to receive an IC chip in the socket. The reciprocating member is also arranged so that the subordinate lever element and the holding means are movable with return motion of the reciprocating member to return the contacts and the holding means to their original positions to detachably retain the IC chip in the socket and to electrically engage the contacts with respective leads in the IC chip with selected force. In that arrangement the reciprocating member is easily moved with forward motion to receive an IC chip within the socket without risk of damage to the socket contacts or chip leads. When the reciprocating member is then moved with return motion, the holding means and contacts return to their original positions to support the IC chip therebetween. The subordinate element moves the contacts together to reduce the risk of damage to individual contacts. The contacts are easily moved by the subordinate elements and are adapted to provide desired resilience and contact forces without requiring such contact arm lengths and the like as will result in significant antenna effects or excessive need for mounting space on a circuit panel or in a testing oven.

BRIEF DESCRIPTION OF THE DRAWINGS

Other objects, advantages and details of the invention appear in the following detailed descriptions of proposed embodiments of the invention, the detailed description referring to the drawings in which.

DESCRIPTION OF THE PREFERRED EMBODIMENTS

Figure 5A:
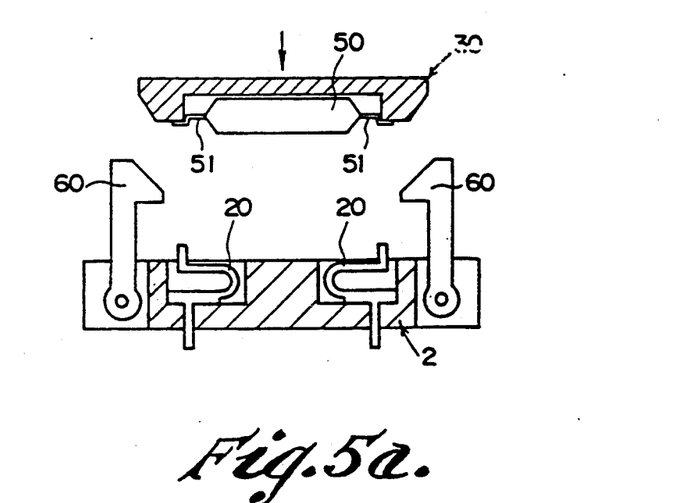
FIGS. 5A–5B are section views along vertical axes of a previously known burn-in test socket illustrating use of the socket.
Figure 5B:
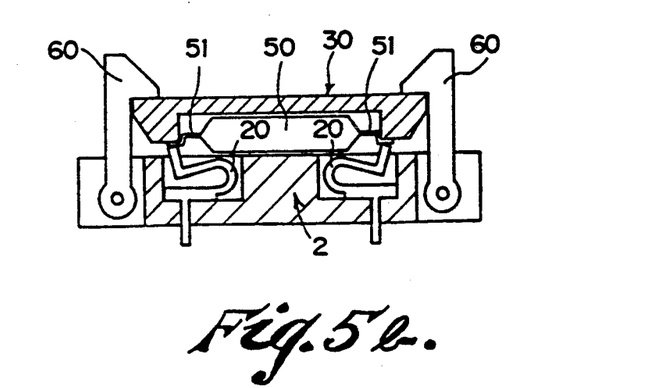

Referring to the drawings, FIGS. 5A–5B illustrate a previously known burn-in test socket which is adapted to receive an integrated circuit (IC) chip or chip package 50 in a chip carrier 30, the chip having a plurality of chip leads 51 arranged in spaced relation to each other along opposite sides of the chip. A large number of blanked contacts 20 are fixed in spaced relation along the sides of a socket body 2 to receive and electrically engage the respective chip leads 51. A pair of latches 60 are rotably mounted in facing relation on the body to receive the IC chip in its carrier therebetween. When as shown in FIG. 5A the carrier is advanced toward the body 2 as indicated by the arrow, the latches 60 are forced to rotate outwardly against bias of springs (not shown) and the chip leads engage and depress the contacts 20 until the latches return to their original position as shown in FIG. 5B to retain the chip leads 51 electrically engaged with the respective contacts 20. When the force pushing the carrier 30 downward is removed, the contacts 20 push up due to their inherent resilience, that upward force being reacted against by the latches so that a contact force is generated between the chip leads and the contacts.

However, such a socket cannot escape such shortcomings as are indicated by (1) through (4) below:

(1) Since the carrier 30 is installed by directly pushing it down until the contacts 20 are deformed, the downward force that is required for the installation of the carrier will ordinarily be around 50 grams per contact 20 with the result that it will be difficult to operate by human hands where the socket has the usually large number of contacts.

(2) Depending upon how the force is applied at the time of installation, the package (or the carrier) is frequently not installed while fully horizontal with the result that the leads 51 and the contact points 20 are shifted relative to each other. Because of this, the IC leads 51 or the contacts tend to be easily deformed as latches 60 are applied.

(3) Since it is not easy to attach or detach the carrier 30, it becomes difficult to automate the operation. In some cases, it becomes impossible to install the carrier 30 unless the accuracy of the installing operation is very high.

(4) The carrier 30 and the main socket body 2 become relatively large as compared with the IC package 50. Since the number of the sockets that can be placed on one printed base plate, etc., becomes smaller, for example, it means that there will be an increase in the number of times when the printed base plate itself needs to be replaced while testing volumes of IC chips. As a consequence of this, a loss of time will also increase even if automation is carried out.

Figure 6A:
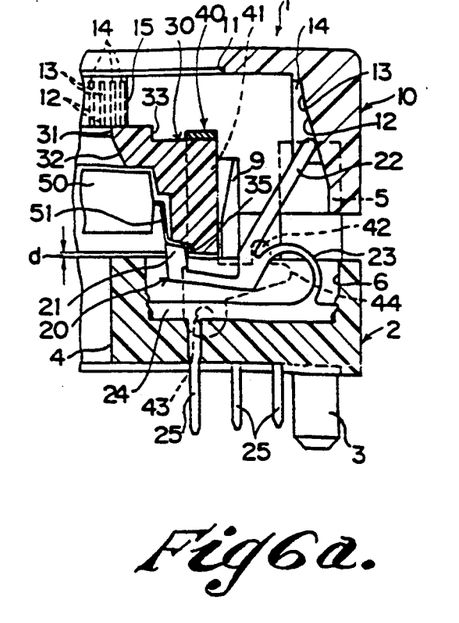
FIGS. 6A–6B are partial section views along vertical axes of another previously known burn-in test socket illustrating use of the socket.
Figure 6B:
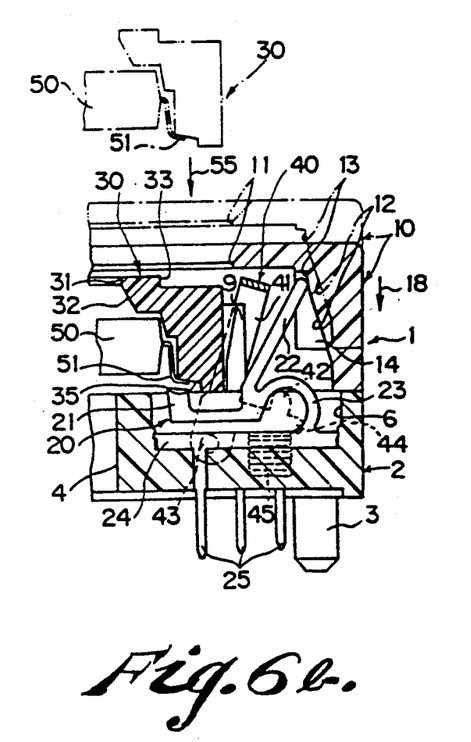

For the purpose of remedying such shortcomings, the present applicants have already proposed a new socket in the above-noted copending application. An example of this previously known device will be explained with reference to FIG. 6.

The contact 20 as shown in FIGS. 6A-6B is formed by pinshaped or blanked electroconductive material and comprises a fixing terminal 24 secured to the base body 2, a curved part 23 which is linked to the fixing terminal 24 and which is bent in the shape of an arc to provide the contact with elasticity or resilience, a sliding part 22 which is linked to the end of the curved part 23, and a compressive part 21.

A latch 40 is arranged as a fixing member at each side of the body 2 to fix the carrier 30 on the body to support the IC package 50 on the base body 2 in such a manner as to be freely detachable. The latch or holding means 40 comprises a fixing lever 41 in the shape of U upstanding from a fulcrum pin 43 which is secured to the main socket body 2, a linking part 44 which extends in the direction of a right angle to this fixing lever 41, and a protruding part 42 which protrudes from the side of the linking part 44. A coil spring 45 is arranged in a concavity formed in the body 2 and the upper end of the spring 45 engages the lower end of the linking part 44 of the fixing part 40. The body 2 has a pin or leg part 3 for positioning the socket on a printed base plate; and the body has a through hole 4, a slide or guide part 5 arranging the cover part 10 for reciprocating motion, a groove 6 for receiving installation of the contacts 20, and a partition plate 9 for guiding the carrier 30 to a prescribed location. The contacts have lead leg parts 25.

The cover 10 has a groove 14 for receiving the sliding part 22 of the aforementioned contacts 20, with the groove 14 having inclined surfaces 12 and 13 whose angles of incline are different for engaging the sliding part 22. The cover has a through hole 11. As is shown in FIG. 6A, the IC package 50 together with the carrier 30 is fixed to the main socket body 2 by means of the U-shaped holders 40 while fixing lever 41 is disposed as shown in FIG. 6A. The contacts 20 have their compressive parts 21 engaged with respective chip leads 51.

Installing the IC package 50 on the main socket body 2 shown in FIGS. 6A-6B will be explained below. As is shown in FIG. 6B, the cover 10 is moved downward (forward motion) in the direction indicated by an arrow 18 by an external force (such as a manual or mechanically applied force) from the initial position indicated in FIG. 6B by broken lines. At this juncture, the sliding parts 22 of the contacts 20 move in the counter-clockwise direction (as seen in FIG. 6B) while sliding on the inclined surface 12. At the same time, the compressive parts 21 of the contacts also move in the same direction. At this initial stage a relatively large force is required for the elastic deformation of the contacts 20. Then as the cover 10 is further moved downward so the slide parts 22 engage the inclined surface 13 which is inclined at a sharper angle than the inclined surface 12, the lower end of the cover 10 contacts the protruded part 42 of each fixing or holding member 40.

By further moving of the cover 10 downward in the direction indicated by an arrow mark 18, the protuberant part 42 is pressed downward by the cover 10 and the fixing member 40 rotates in the clock-wise direction in opposition to the force of the spring 45 using the pin 43 as the fulcrum. In that way, the lever 40 opens in such a manner that the carrier 30 may be inserted.

As the cover 10 is further pushed down until it may contact the main socket body 2, the members 40 (with the lever 41) remains in an open state to receive the carrier 30. The fixed spring 45 which is located between the linking part 44 of the fixing member 40 assumes a compressed state.

As described earlier, the inherent resilience of repulsive force of the contacts 20 become weak as compared with the force with which the sliding part 22 was first moved in the counterclockwise direction because of the sharper angle of the inclined surface 13, with a consequence that it is easier to push down the protruding part 42 of the fixing member 40 in opposition to the spring force of the spring 45. Accordingly, a moderately compressing force will be required. Therefore, operation can frequently be carried out smoothly without requiring an unnecessary force in connection with its action. Here, the inclined surface 13 can also be a perpendicular surface. That is, the action for moving the sliding part 22 of the contacts 20 is separated in time from the action for moving the protruding part 42 of the fixing or holding members 40.

When the holding member 40 is sufficiently open, the IC package 50, installed on the carrier 30, is easily inserted through the hole 11 in the cover 10 in the direction indicated by an arrow 55, thereby positioning the IC package 50 at a prescribed location on the main socket body 2.

By subsequently releasing the force that forces the cover 10 downward, the fixing member 40, the contacts 20, and the cover 10 move in an opposite direction toward their original positions.

That is, the fixing lever 41 rotates in the counterclockwise direction by the restorative force of the compressed spring 45 and is returned to its original position. The cover 10 is pushed back to its original position by the elastic restorative force of the contacts 20 as applied to the cover by the contact parts 22. Because the fixing member 40 and the contacts 20 are pushed back toward their original position, they assume the state shown in FIG. 6A. At this juncture, there is a space d in a range between approximately 0.15 and 0.20 millimeters between the bottom of the carrier 30 and the main socket body 2. That is, the cover is uplifted from the main socket body 2.

In that way, the IC chip (plus the carrier 30) is retained on the main socket body and the contacts 20 are resiliently pressed against the chip leads 51.

As will be understood, the contacts 20 and the holding member 40 are initially displaced from their original positions with downward movement (forward motion) of the cover 10 and the IC package 50 on the carrier 30 is inserted into the socket. The fixing member 40 and the contacts 20 are returned toward their original positions, and the IC package 50 is retained on the socket during the movement (return motion) of the cover 10 to its original position. Basically, therefore, it is possible to fix the IC package 50 in the socket by a simple action involving the reciprocating movement (up and down movement in this example) of the cover 10.

Accordingly, it becomes possible to insert the carrier while the contacts are displaced by the cover with a result that no force will be required for the installation of the carrier, thereby making its operation easier to carry out. Since it is no longer necessary to carry out a complicated operation as in the past, it becomes easily possible to install the IC package 50 in the socket in a freely detachable manner even in automatic machines, etc. This is highly advantageous for the facilitation of automation.

Since the bias or displacement of the contacts can be realized by an even compressive force by the cover, there is no lateral shifting between the chip leads and the socket contacts. The latch or holding means is also more compact so that it becomes easier to miniaturize the socket. However, it is found that the following problems (1) and (2) are encountered.

(1) In view of the fact that the sliding part 22 on the contact 20 is somewhat long in an arm-like shape, it tends to function as an antenna with the result that noise tends to get into the output signal at the time of a burn-test; and (2) Because of the size of the sliding part 22, the overall size of the contacts become greater, with resulting cost and loss of compactness.

The socket of the present invention has a structure in which the attachment and detachment of an electrical component such as an IC chip can be carried out easily. The forces involved in operability and contact pressure are both satisfactory. Miniaturization is possible and the socket is suitable for automation. The socket is also operable with reduced risk of noise getting into the output signal.

The socket of the invention comprises a contact to be electrically connected in an elastically compressed state to a lead of an electrical component installed in the socket, a fixing or holding member for detachably retaining the component in the socket, a reciprocating motion member provided on the socket body, and a subordinate element that is engaged with both the reciprocating motion member and the contact. Movement of the subordinate element is linked to forward motion of the reciprocating motion member for displacing the contact from its original position. The fixing or holding member is also displaced from its original position in linkage with forward movement of the reciprocating motion member. The electrical component such as an IC chip is easily inserted into the socket in this state and the fixing member and the contact as well as the subordinate element are then returned toward their respective original positions for detachably retaining the component in the socket with the component lead electrically engaged by the contact.

Figure 1:
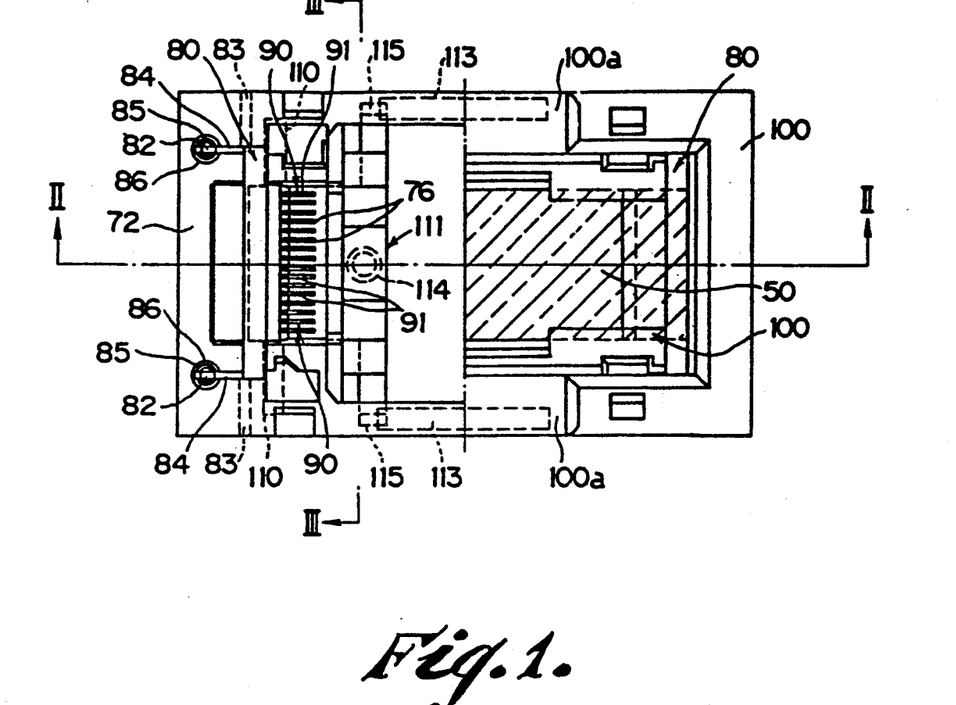
FIG. 1 is plan view partly cut away of a preferred embodiment of the socket of the invention.
Figure 2:
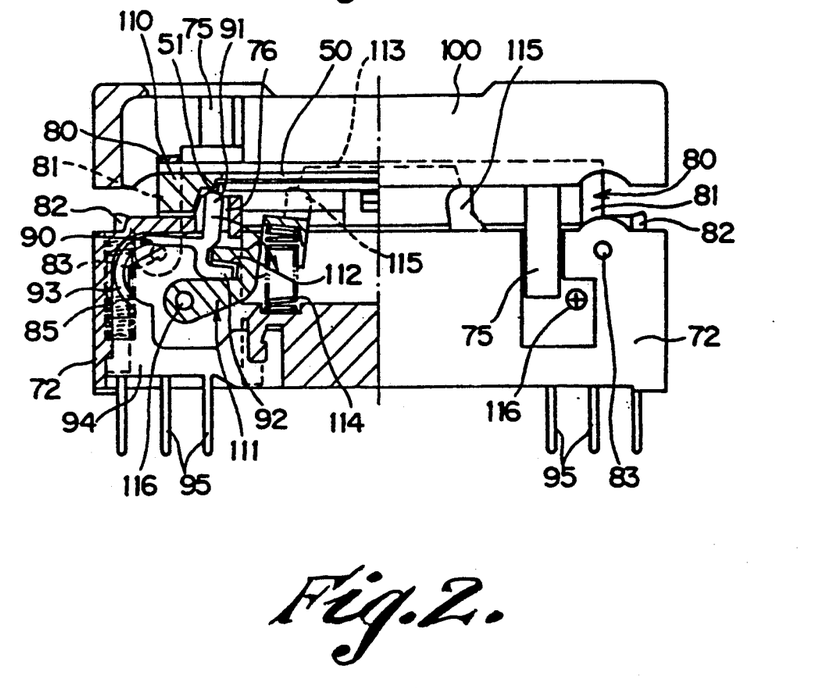
FIG. 2 is a side elevation view partly in section of the socket of FIG. 1, the section being taken along line II—II of FIG. 1.
Figure 3:
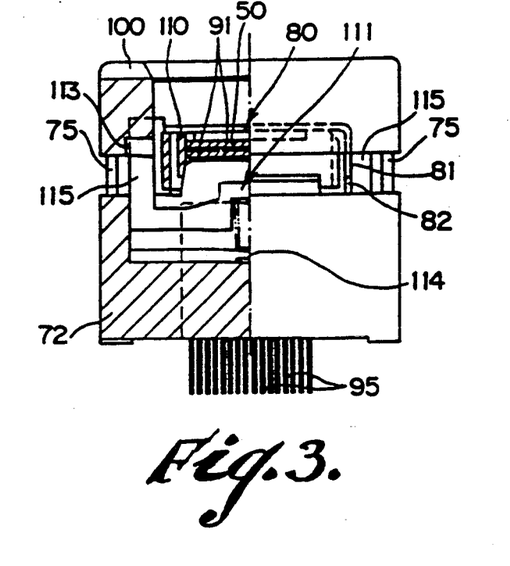
FIG. 3 is an end elevation view partly in section of the socket of FIG. 1.

Referring to the drawings, FIGS. 1-3 show the socket of the invention adapted for IC chip burn-in test. The socket comprises a plurality of contacts 90 blanked from resilient, electroconductive material. Each contact includes a fixing terminal 94 secured to an electrically insulating base body 72, an elastic or resilient curved part 93 connected to the terminal 94, a lead end 95, protuberant part 92, and a compressive part or contact point 91 disposed at the end of the curved part 93. The curved parts of the contact are relatively short as shown.

A latch 80 is arranged as a fixing or holding means to detachably retain the carrier 110 with an IC package 50 on the body 72. The holding member comprises a fixing lever part 81 which is approximately in the shape of U upstanding from a fulcrum pin 83 fixed on the body 72, a linking part 84 which extends at a right angle direction to the fixing lever 81, and a protruding part 82 that sticks out of the linkage part 84 at one side of the fixing lever 81. A concavity part 86 is formed on the socket body 72 to receive a coil spring 85 and the upper end of the spring 85 is arranged to engage the lower end of the link part 84 of the fixing or latch member 80.

The cover 100 has a guide part 75 for guiding sliding reciprocating movement of the cover on the body 72.

A large number of contacts 90 are arranged in spaced relation to each other along each of two sides of the body 72 and the respective contact points 91 are arranged inside slits 76 formed in the body 72. The protruding part 92 of each contact is inserted into and engaged with a corresponding recess, slit or concavity 112 in a subordinate lever 111 that is journaled on the body 72 to be rotatable around the fulcrum 116. The slits 112 are spaced along the length of the lever 111 and link movement of the contacts to movement of the lever 111. Movement of the subordinate lever 111 is also linked to movement of the reciprocating cover 100 by arranging a concave part 113 on the lower surface of both sides 100a of the cover as cam surfaces. The subordinate lever 111 is biased to move rotably in the counter clockwise direction as viewed in FIG. 2 by a compressive spring 114 fixed to the body 72.

Cam action between protruding parts 115 on the subordinate lever element 111 and the concave part 113 is adapted to rotate the subordinate lever 111 in the clockwise direction during downward movement of the cover 100 for elastically deforming the contacts 90 (the curved part 93, in particular).

Figure 4A:
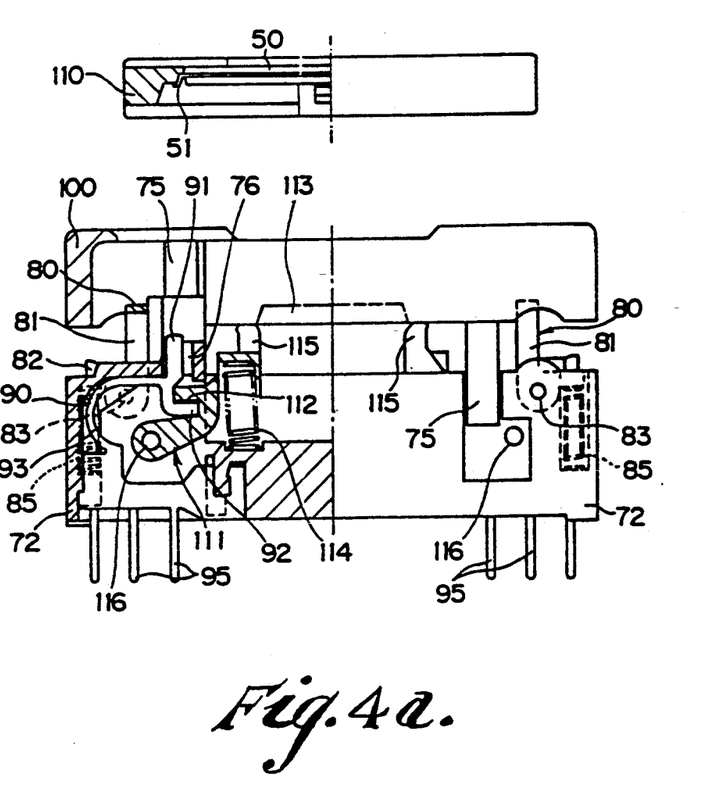
FIGS. 4A–4D are side elevation views partly in section similar to FIG. 2 illustrating use of the socket.
Figure 4B:
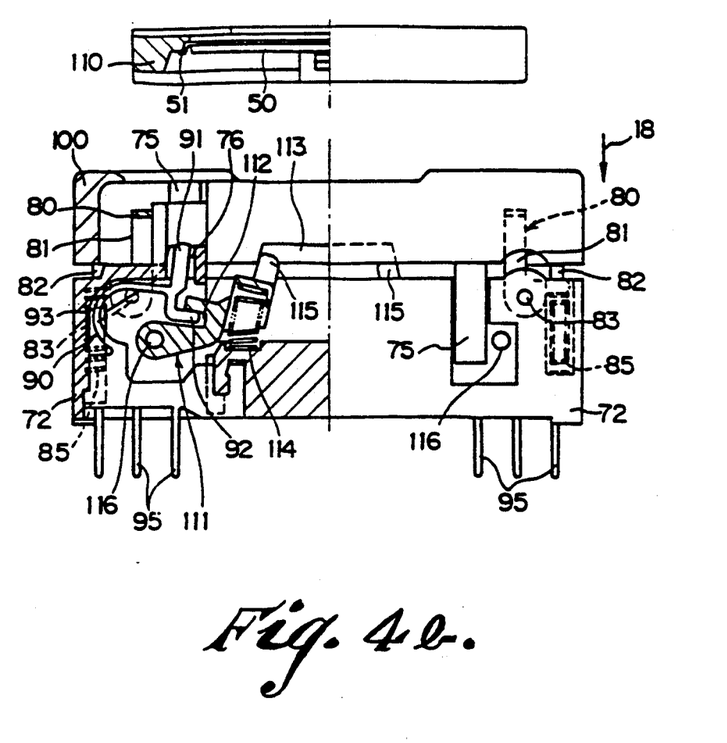

To install a chip 50 in the socket, the cover 100 as shown in FIG. 4A, is moved downward (forward motion) in a direction which is shown by an arrow mark 18 as shown in FIG. 4B by an external force. The protruding parts 115 of the subordinate lever 111 are pushed downward by the lower surface of the cover 100 to compress the spring 114 somewhat. At the same time, the subordinate lever 111 rotates in the clockwise direction around pin 116 as the protruding part 115 slides on the lower surface of the cover part 100.

As a consequence, each contact 90 follows the rotation of the lever 111 and elastically deforms so that the curved part 93 draws down the contact point 91. The protruding part 115 of the subordinate lever 111 then enters the concave part 113 on the lower surface of the cover 100. As the cover 100 is further pushed downward, the lower surface of the cover 100 contacts the protrusions 82 of each fixing member (latch) 80, thereby pushing it downward, with a result that the latch 80 also rotates in the counterclockwise direction around pin 83 in opposition to the spring 85. At this juncture, the compressive force of the cover part 100 against the lever 111 starts to be reduced as the protruding parts 115 of the lever 111 enter the concave parts 113 of the cover 100. The cover 100 is then pushed downward until it tightly abuts the base 72, with a result that the lever part 111 is not further lowered by the cover 100 and the contact point 91 is disposed completely inside the slit 76 in the base 72.

Figure 4C:
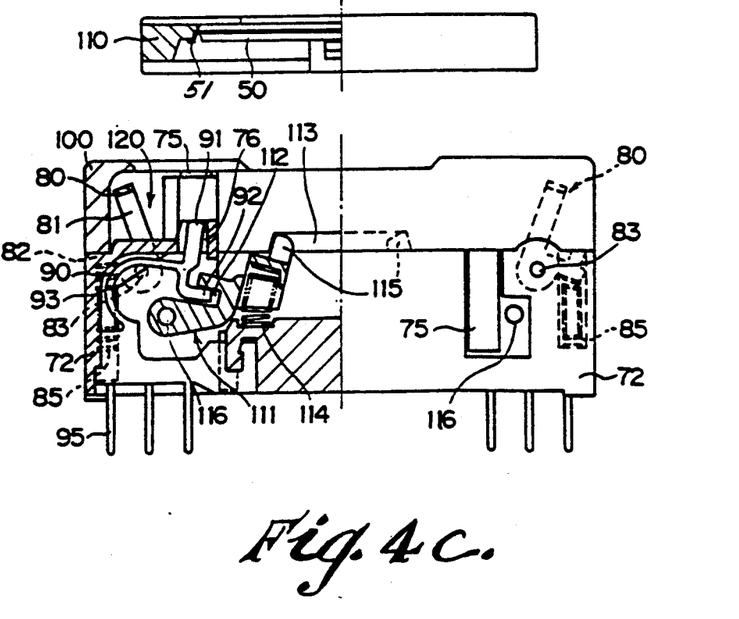
Figure 4D:
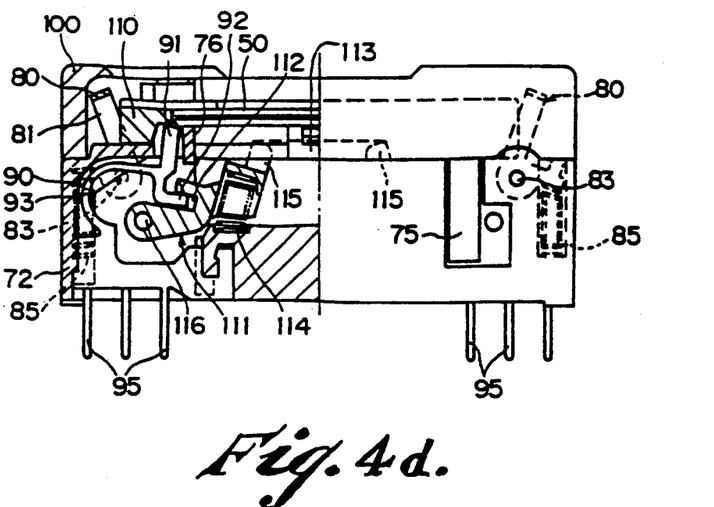

In addition, the latch 80 is open to such a width as to permit the installation of a carrier-equipped IC chip. That is, the latches 80 open outwardly (to the right and to the left), thereby making it possible to secure a space 120 for inserting the carrier 110. Thereafter, the IC 50 which has been installed in the carrier 110 is inserted into the cover opening as shown in FIG. 4D. Subsequent to this insertion, the force that has been pushing down the cover 100 is released so that the latch 80 engages in a circular movement around pin 83 in the direction of the center of the socket, thereby covering the upper surface of the carrier 110. As the force on the cover is further released, the lever 111 is eventually pushed upward by the force of the spring 114. Subsequent to this, the lever 111 rotates within the socket and the contact point 91 on each contact 90 naturally rises in response to its inherent elastic restorative force. As is shown in FIG. 1, it engages a lead part 51 of the IC 50 in the carrier 110 with desired contact pressure. The cover part 100 also rises and is restored to its original position. At this juncture, the force of the contacts 90 pushes up the IC 50 and the latches 80 counter that force to retain the IC chip leads engaged by the socket contacts.

In order to withdraw the carrier 110 from the socket, it is necessary to push down the cover 100 once again in the same manner as described above, thereby making it possible to withdraw the carrier after releasing the pressure from the latches 80 and the contact points 91.

As has been explained above, the socket of the invention is so constructed that the subordinate elements 111, contacts 90 and fixed members 80 are displaced from their original positions in linkage with the forward or downward motion of the cover 100 by an external force. The IC package 50 in the carrier 110 is inserted into the socket, and the holders or fixed members 80 as well as contacts 90 and the subordinate element 111 are returned to their original positions, thereby carrying out the detachable mounting and electric connection to the IC package 50 during return movement of the cover 100. Basically, therefore, it becomes possible to fix the IC package 50 in the socket by an extremely simple action involving the reciprocating motion (up and down or forward and return movement) of the cover 100.

That is, it becomes possible to insert the carrier while the contacts are depressed by movement of the cover part so that no force will be required for the carrier insertion.

In view of the fact that the lever 111, contact point 91 and the latch 80 can be moved by merely pushing down the cover part, moreover, the action involves only the addition of a force applied in a straight line, with the carrier-equipped IC being easily installed either mechanically or manually. In addition, since the biasing of the contacts can be materialized by an even, compressive force by the cover part, there is no lagging between the leads and the contacts during chip insertion so that there is no deformation of the leads or contacts.

Since the action involves the presence of a lever 111, the moving action of the contacts becomes smooth. Since the contacts are rotated on the basis of the lever principle, it becomes possible to use a smaller force to move the contacts than would be required by the direct movement. Where the contacts are first deformed as shown in FIG. 4B and the latch 80 is rotated as shown in FIG. 4C with a time lag between those movements the protruding part 115 of the lever 111 is received into the concave part 113 of the cover part 100, it is only necessary for the force that pushes the cover 100 during the last part of that movement to be larger than the force that opposes the spring 85 of the latch 80. Accordingly, a smaller compressive force can be employed without wasting force to permit carrying out a smooth operation. Nevertheless, the desired contact pressure between the lead 51 and the contact point 91 is achieved by the combination of latches 80, contacts 90, and the levers 111. Further, because the lever 111 is provided in a satisfactory manner, the space inside the socket is utilized effectively making it possible to make a small-sized socket.

As compared with the socket described in FIG. 6, the various parts of the contact element 90 are compact in size. The lever 111 is preferably made of a molding resin which is electrically insulating. Because of this, the contacts are compact but easily moved. Therefore, the contacts are less subject to the effect of noise, to improve testing performance. To reduce the size of the contacts also reduces the cost.

This invention has been described above in the form of examples; however, the above-described examples can be further modified within the technical concept of this invention.

For example, the shapes, materials and installation locations of the aforementioned contact element, fixing member and the subordinate lever may be modified variously and the shape, material and the structure of the cover part (reciprocating motion member) and the angle of the inclined surface can also be modified.

In addition, the materials, shapes and structures of the main socket body and carrier can be suitably selected. Moreover, the IC chip does not necessarily have to be installed in a carrier but can be inserted directly into the socket.

Further, although the cover was displaced in the up-and-down direction in the above-noted example for the insertion of the IC chip, etc., into the socket, it could be arranged to operate by displacement in a another direction such as the horizontal direction.

The fixing of the IC chip and the restoration of the cover part to its original position may be carried out sequentially or at the same time. In addition, the shape, installing methods and kind of the spring that is to be provided between the fixed member and the main socket body may be modified.

Moreover, the engaging state and position between the contact element and the subordinate lever may be modified in conformity with the shape of the subordinate lever. The subordinate lever may be of the rotary type in addition to what has been described above.

This invention can, of course, be used in the electrical parts other than the aforementioned IC chip.

According to this invention which has been described above, the subordinate element and the contact element plus the fixing member are displaced from the original positions in linkage with the forward motion of a reciprocating motion member, thereby to permit inserting the electrical component into the socket; the fixing member, contact element, and the subordinate element are thereafter returned to their original positions for effecting detachable mounting of the component in the socket by return movement of the reciprocating motion member. Therefore, it becomes possible to insert an electrical component while the contact elements are biased by the reciprocating motion member, with a consequence that no force will be required for the installation of an electric part and that the operation becomes easier to carry out.

In addition, it becomes easier to effect automation by using an automatic machine, etc. Since it has a reciprocating motion structure employing a reciprocating motion member, it becomes possible to miniaturize the socket itself, too. Inasmuch as the subordinate element is arranged utilizing the space inside the socket, it becomes possible to reduce the size of the socket. Since the structure is one in which the contacts are displaced by a subordinate element, the contacts can be made compact so that the structure is affected by noise to a reduced extent.

We claim:

1. A socket for receiving an electrical component comprising a body, holding means for detachably retaining said electrical component on the body, a contact for electrically engaging said electrical component with selected force when the component is retained on the body, a reciprocating member mounted for forward and return motion, and a subordinate element which is not one piece with the contact and is arranged to be engaged with the reciprocating member and with the contact, the subordinate element and holding means being movable with forward motion of the reciprocating member to displace the contact and the holding means from original positions thereof to receive said electrical component on the body and being movable with return motion of the reciprocating member to return the contact and the holding means to their original positions for detachably retaining the component on the body with the contact electrically engaging the component with the selected force.

2. A socket for mounting an integrated circuit chip to electrically connect a plurality of leads on the chip into an electrical circuit comprising a socket body, holding means mounted on the body for detachably retaining an integrated circuit chip received in the socket, a plurality of contacts mounted on the body for electrically engaging respective leads on the integrated circuit chip with selected force when the chip is being retained in the socket, a reciprocating cover mounted on the body for forward motion toward the body and return motion away from the body, and a subordinate element which is not one piece with the contacts and is rotably mounted on the body to be engaged with the reciprocating cover and with the contacts, the subordinate element and holding means being movable with forward motion of the reciprocating cover to displace the contacts and the holding means from original positions thereof to receive an integrated circuit chip in the socket and being movable with return motion of the reciprocating cover to return the contacts and the holding means to their original positions for detachably retaining the integrated circuit chip in the socket with the contacts electrically engaging respective leads of the chip with the selected force.

3. A socket according to claim 2 wherein the contacts mounted on the body are resilient and are inherently biased to return to their original positions.

4. A socket according to claim 2 wherein spring means resiliently bias the holding means to the original position thereof and the reciprocating cover is adapted to engage the holding means during forward motion of the cover to displace the holding means from the original position thereof against bias of the spring means and to return the holding means toward the original position thereof in response to bias of the spring means during return motion of the reciprocating cover.

5. A socket according to claim 2 wherein spring means resiliently bias the subordinate element to move to an original position thereof, and the reciprocating cover is adapted to engage the subordinate element during forward motion of the cover to move the subordinate element against bias of the spring means to displace the contacts from original position thereof and to permit the subordinate element to return to the original position thereof in response to bias of the spring means to return the contacts to original positions thereof during return motion of the cover.

6. A socket according to claim 2 wherein the contacts are resilient and are inherently biased to return to their original positions, first spring means are mounted on the body and bias the holding means to the original position thereof, and second spring means are mounted on the body and bias the subordinate element to an original position thereof, the holding means and subordinate element being movable with forward motion of the reciprocating cover against the bias of the first and second means to displace the holding means and to displace the contacts against their inherent resilience to receive the integrated circuit chip in the socket and being movable in response to bias of the first and second spring means to return to their original positions with return motion of the reciprocating cover to permit the contact to return to their original positions in response to inherent bias thereof to detachably return the chip in the socket with the contacts electrically engaging respective chip leads with the selected force.

* * * * *